United States Patent
Rhee et al.

[11] Patent Number: 6,160,432
[45] Date of Patent: Dec. 12, 2000

[54] SOURCE-SWITCHED OR GATE-SWITCHED CHARGE PUMP HAVING CASCODED OUTPUT

[75] Inventors: Woogeun Rhee; Matteo Conta, both of Irvine, Calif.

[73] Assignee: Conexant Systems, Inc., Newport Beach, Calif.

[21] Appl. No.: 09/302,666

[22] Filed: Apr. 30, 1999

[51] Int. Cl.[7] .................................................. H03L 7/06
[52] U.S. Cl. .......................... 327/157; 327/538; 327/541; 327/543; 307/110; 363/59; 363/60
[58] Field of Search .................................... 327/148, 157, 327/538, 540, 541, 543; 307/110; 363/59, 60

[56] References Cited

U.S. PATENT DOCUMENTS

| | | | |
|---|---|---|---|
| 4,583,037 | 4/1986 | Sooch | 323/315 |
| 5,459,755 | 10/1995 | Iga et al. | 375/376 |
| 5,473,283 | 12/1995 | Luich | 331/8 |
| 5,485,125 | 1/1996 | Dufour | 331/17 |
| 5,532,636 | 7/1996 | Mar et al. | 327/543 |
| 5,646,563 | 7/1997 | Kuo | 327/157 |
| 5,670,869 | 9/1997 | Weisenbach | 323/313 |
| 5,699,387 | 12/1997 | Seto et al. | 375/376 |
| 5,736,872 | 4/1998 | Sharma et al. | 327/3 |
| 5,767,736 | 6/1998 | Lakshmikumar et al. | 327/536 |
| 5,801,578 | 9/1998 | Bereza | 327/536 |
| 5,815,041 | 9/1998 | Lee et al. | 331/8 |
| 5,831,484 | 11/1998 | Lukes et al. | 331/17 |
| 5,877,658 | 3/1999 | Baba | 331/18 |
| 6,052,015 | 4/2000 | Desbonnets | 327/382 |
| 6,054,882 | 4/2000 | Izumikawa | 327/157 |

*Primary Examiner*—Timothy P. Callahan
*Assistant Examiner*—An T. Luu
*Attorney, Agent, or Firm*—Lyon & Lyon LLP

[57] ABSTRACT

A source-switched or gate-switched charge pump having a cascoded output. A first current-mirror comprised of p-channel CMOS transistors is coupled on one side of an output node and a second current mirror comprised of n-channel CMOS transistors is coupled on the opposite side of the output node. A reference current source is coupled between the current mirrors. A p-channel CMOS cascode transistor is coupled between the first current mirror and the output node, and an n-channel CMOS cascode transistor is coupled between the second current mirror and the output node. A p-channel CMOS transistor switch is coupled to either the source or the gate of the output transistor of the first current mirror and receives a first control signal at its gate. An n-channel CMOS transistor switch is coupled to either the source or the gate of the output transistor of the second current mirror and receives a second control signal at its gate.

26 Claims, 4 Drawing Sheets

SOURCE-SWITCHED OR GATE-SWITCHED CHARGE PUMP HAVING CASCODED OUTPUT

FIELD OF THE INVENTION

The present invention relates generally to charge pumps used in circuits such as phase-locked loops and, more particularly, relates to a charge pump having a source- or gate-switched configuration in combination with a cascoded output to reduce both switching noise and switching time.

BACKGROUND OF THE INVENTION

Many electrical and computer applications and components have critical timing requirements that compel generation of periodic clock waveforms that are precisely synchronized with a reference clock waveform. A phase-locked loop ("PLL") is one type of circuit that is widely used to provide an output signal having a precisely controlled frequency that is synchronous with the frequency of a received or input signal. Wireless communication devices, frequency synthesizers, multipliers and dividers, single and multiple clock generators, and clock recovery circuits are but a few examples of the manifold implementations of PLLs.

Frequency synthesis is a particularly common technique used to generate a high frequency clock from a lower frequency reference clock. In microprocessors, for example, an on-chip PLL can multiply the frequency of a low frequency input (off-chip) clock, typically in the range of 1 to 4 MHz, to generate a high frequency output clock, typically in the range of 10 to over 200 MHz, that is precisely synchronized with the lower frequency external clock. Another common use of PLLs is recovery of digital data from serial data streams by locking a local clock signal onto the phase and frequency of the data transitions. The local clock signal is then used to clock a flip-flop or latch receiving input from the serial data stream.

FIG. 1 is a block diagram of a typical PLL 10. PLL 10 comprises phase/frequency detector 12, charge pump 14, loop filter 16, voltage-controlled oscillator ("VCO") 18 and frequency divider 20. PLL 10 receives a reference clock signal $CLK_{REF}$ having a frequency $F_{REF}$ and generates an output clock signal $CLK_{OUT}$ having a frequency $F_{OUT}$ that is synchronized with the reference clock signal in phase. The output clock frequency is typically an integer (N) multiple of the reference frequency; with the parameter N set by frequency divider 20. Hence, for each reference signal period, there are N output signal periods or cycles.

Phase/frequency signal detector 12 receives on its input terminals two clock signals $CLK_{REF}$ and $CLK^*_{OUT}$ ($CLK_{OUT}$, with its frequency $F_{OUT}$ divided down by frequency divider 20). In a conventional arrangement, detector 12 is a rising edge detector that compares the rising edges of the two clock signals. Based on this comparison, detector 12 generates one of three states. If the phases of the two signals are aligned, the loop is "locked". Neither the UP nor the DOWN signal is asserted and VCO 18 continues to oscillate at the same frequency. If $CLK_{REF}$ leads $CLK^*_{OUT}$, than VCO 18 is oscillating too slowly and detector 12 outputs an UP signal proportional to the phase difference between $CLK_{REF}$ and $CLK^*_{OUT}$. Conversely, if $CLK_{REF}$ lags $CLK^*_{OUT}$, than VCO 18 is oscillating too quickly and detector 12 outputs a DOWN signal proportional to the phase difference between $CLK_{REF}$ and $CLK^*_{OUT}$. The UP and DOWN signals typically take the form of pulses having a width or duration corresponding to the timing difference between the rising edges of the reference and output clock signals. They have a complementary relationship such that neither is asserted at the same time and, if one is asserted, the other is not asserted.

Charge pump 14 generates a current $I_{CP}$ that controls the oscillation frequency $F_{OUT}$ of VCO 18. $I_{CP}$ is dependent on the signal output by phase/frequency detector 12. If charge pump 14 receives an UP signal from detector 12, indicating that $CLK_{REF}$ leads $CLK^*_{OUT}$, $I_{CP}$ is increased. If charge pump 14 receives a DOWN signal from detector 12, indicating that $CLK_{REF}$ lags $CLK^*_{OUT}$, $I_{CP}$ is decreased. If neither an UP nor a DOWN signal is received, indicating that the clock signals are aligned, charge pump 14 does not adjust $I_{CP}$.

Loop filter 16 is positioned between charge pump 14 and VCO 18. Application of the charge pump output current $I_{CP}$ to loop filter 16 develops a voltage $V_{LF}$ across filter 16. $V_{LF}$ is applied to VCO 18 to control the frequency $F_{OUT}$ of the output clock signal. Filter 16 also removes out-of-band, interfering signals before application of $V_{LF}$ to VCO 18. A common configuration for a loop filter in a PLL is a simple single-pole, low-pass filter that can be realized with a single resistor and capacitor.

Oscillator 18 generates an oscillating output signal $CLK_{OUT}$ having a frequency $F_{OUT}$ proportional to the voltage $V_{LF}$ applied to VCO 18. Conventional voltage-controlled oscillators typically oscillate about a specific center frequency and have a relatively narrow frequency range or bandwidth. When $CLK_{REF}$ leads $CLK^*_{OUT}$, charge pump 14 increases $I_{CP}$ to develop a greater $V_{LF}$ across loop filter 16 which, in turn, causes VCO 18 to increase $F_{OUT}$. Conversely, when $CLK_{REF}$ lags $CLK^*_{OUT}$, charge pump 14 decreases $I_{CP}$ to develop a lesser $V_{LF}$ across loop filter 16 which, in turn, causes VCO 18 to decrease $F_{OUT}$. When $CLK_{REF}$ and $CLK^*_{OUT}$ are aligned, $V_{LF}$ is not adjusted, and $F_{OUT}$ is kept constant. In this state, PLL 10 is in a "locked" condition.

The output clock signal is also looped back through (in some applications) frequency divider 20. The resultant output $CLK^*_{OUT}$ is provided to phase/frequency detector 12 to facilitate the phase-locked loop operation. Frequency divider 20 divides $F_{OUT}$ by the multiplication factor N to obtain a divided clock. Divider 20 may be implemented using counters, shift registers, or through other methods familiar to those of ordinary skill in the art. Thus, PLL 10 compares the reference clock phase to the divided clock phase and eliminates any detected phase difference between the two by adjusting the frequency of the output clock.

A conventional charge pump circuit 50, suitable for implementation in PLL 10, is illustrated in schematic detail in FIG. 2. Charge pump 50 includes a "pump-up" p-channel CMOS ("PMOS") current mirror 54 and an associated "UP" PMOS switching transistor M5 coupled at an output node 51 to a "pump-down" n-channel CMOS ("NMOS") current mirror 56 and an associated "DOWN" NMOS switching transistor M6.

Current mirror 54 includes a mirror transistor M1 having a gate coupled to the gate of an associated mirror transistor M3. The sources of transistors M1 and M3 are coupled to a voltage supply $V_{DD}$. The drain of transistor M1 is coupled to its gate, in order to insure that the transistor remains in saturation, and the drain of transistor M3 is coupled to the source of UP switching transistor M5. Current mirror 56 is implemented with NMOS mirror transistors M2 and M4. The gates of transistors M2 and M4 are coupled together, and their sources are tied to ground. The drain of transistor M2 is coupled to its gate, and the drain of transistor M4 is coupled to the source of DOWN switching transistor M6. The drains of switching transistors M5 and M6 are coupled to output node 51.

A reference current source providing a reference current $I_{REF}$ is disposed between the drains of mirror transistors M1 and M2. Based on the signals applied to the gates of switching transistors M5 and M6 by the phase/frequency detector (which would be connected to charge pump 50 as shown in FIG. 1), the reference current is mirrored through either pump-up current mirror 54 or through pump-down current mirror 56 to direct an output current $I_{CP}$ to or from output node 51. When an "UP" signal is applied to switching transistor M5, consisting of a voltage level sufficient to place transistor M5 in saturation and thereby turn it "on", the reference current is mirrored in the M3-M5 branch. Charge pump 50 thereby outputs a current $I_{CP}$ equal to $+I_{REF}$. Conversely, if a "DOWN" signal is applied to switching transistor M6, transistor M6 turns on and the reference current is mirrored in the M6-M4 branch. Charge pump 50 outputs a current $I_{CP}$ equal to $-I_{REF}$.

A loop filter 52 is coupled to output node 51. The charge pump current $I_{CP}$ is input to filter 52 to generate a voltage $V_{LF}$ that is applied to a voltage-controlled oscillator (which would be connected to loop filter 52 as shown in FIG. 1). Loop filter 52, as shown, consists of a series-connected resistor R and capacitor C1 in parallel with a capacitor C2. Filter 52 could take alternative forms, such as simply a series-connected resistor and capacitor. If $I_{CP}=+I_{REF}$, the integrating capacitor formed by the combination of capacitors C1 and C2 is charged and $V_{LF}$ increases. If $I_{CP}=-I_{REF}$, the integrating capacitor is discharged and $V_{LF}$ decreases. The oscillating frequency is thereby adjusted as necessary to correct phase differences detected by the phase/frequency detector.

In typical charge pumps such as pump 50, the UP and DOWN pulses generated by the phase/frequency detector must have a minimum width (duration) in order to ensure that the charge pump has time to turn on. Small phase differences that would result in generation by the detector of UP and DOWN pulses having a duration less than this minimum width are referred to as being in the "dead zone" of the circuit. The dead zone, then, is essentially a range of phase differences in response to which the phase detector cannot produce pulses of sufficient duration to activate the charge pump. When in the dead zone, the oscillator may drift from the center frequency since the charge pump is unable to correct phase differences occurring within this zone. Accordingly, frequency synthesizers exhibit poor frequency selectivity while in the dead zone. From the standpoint of avoiding dead zone problems, then, it is desirable to increase the duration or "turn on" time of the ON/OFF pulses produced by the phase/frequency detector.

During the charge pump switching time, spikes or "spurs" may result on the output node from sources such as switching noise and transistor mismatch in the current mirrors. This is detrimental to the performance of the PLL or frequency synthesizer and, when implemented in RF transceivers, ultimately degrades the sound quality and clarity (selectivity). From the standpoint of noise and spur reduction, then, it is desirable to decrease the charge pump switching time and the duration of the detector ON/OFF pulses.

Hence, there exists a trade-off between designing for better spur and noise performance through decreasing charge pump switching time and detector pulse duration, and designing for a smaller dead zone by increasing the detector pulse duration. The minimum pulse duration for dead zone removal is dictated by the switching time performance of the charge pump. Previous approaches for improving frequency selectivity, such as inclusion of an active loop filter, lead to excessive current consumption levels not suitable for commercial applications.

In view of the above, there is a need for a charge pump that overcomes the problems of the prior art.

SUMMARY OF THE INVENTION

In accordance with the purpose of the invention as broadly described herein, there is provided a charge pump in which a source- or gate-switched configuration is combined with cascoded output to reduce both switching noise and switching time. The reduced switching time, in turn, permits shorter duration pulses from the phase/frequency detector.

In one embodiment of the present invention, a charge pump comprising a reference current source and an output node is provided. First and second cascode circuits are coupled to the output node. A first current mirror is coupled between the first cascode circuit and the reference current source for mirroring a first mirror current from the reference current source, and a second current mirror is coupled between the second cascode circuit and the reference current source for mirroring a second mirror current from the reference current source. A first switch is separated from the output node by at least one transistor and has first and second states. It is normally in the first state, and is configured to achieve the second state upon assertion of a first control signal. When the first switch achieves the second state, the first mirror current is directed through the first cascode circuit to the output node. A second switch is also separated from the output node by at least one transistor and has first and second states. It is normally in the first state, and is configured to achieve the second state upon assertion of a second control signal. When the second switch achieves the second state, the second mirror current is directed through the second cascode circuit to the output node.

In one implementation of this embodiment, the first current mirror, cascode circuit and switch are comprised of p-channel CMOS transistors and the first control signal is an "UP" signal from a phase/frequency detector. In this implementation, the second current mirror, cascode circuit and switch are comprised of n-channel CMOS transistors and the second control signal is a "DOWN" signal from the phase/frequency detector.

In another embodiment of the present invention, a source-switched, cascoded-output charge pump having a reference current source and an output node is provided. A first cascode transistor is coupled to a first side of the output node, and a first output mirror transistor is coupled between the first cascode transistor and the reference current source. A first switching transistor is coupled to the source of the first output mirror transistor and receives a first control signal at its gate. The first control signal, when asserted, turns on the first switching transistor and causes the reference current source to be mirrored through the first cascode transistor in a direction towards the output node. The source-switched charge pump further comprises a second cascode transistor coupled to a second side of the output node, and a second output mirror transistor coupled between the second cascode transistor and the reference current source. A second switching transistor is coupled to the source of the second output mirror transistor receives a second control signal at its gate. The second control signal, when asserted, turns on the second switching transistor and causes the reference current source to be mirrored through the second cascode transistor in a direction away from the output node.

In one implementation of the source-switched charge pump, the first switching transistor has a source connected to a voltage supply and a drain connected to the source of the first output mirror transistor. The second switching transistor has a source connected to ground and a drain connected to the source of the second output mirror transistor.

In a further embodiment of the present invention, a gate-switched, cascoded-output charge pump having a reference current source and an output node is provided. A first cascode transistor is coupled to a first side of the output node, and a first output mirror transistor is coupled between the first cascode transistor and the reference current source. A first switching transistor is coupled to the gate of the first output mirror transistor and receives a first control signal at its gate. The first control signal, when asserted, turns on the first switching transistor and causes the reference current source to be mirrored through the first cascode transistor in a direction towards the output node. The gate-switched charge pump further comprises a second cascode transistor coupled to a second side of the output node, and a second output mirror transistor coupled between the second cascode transistor and the reference current source. A second switching transistor is coupled to the gate of the second output mirror transistor receives a second control signal at its gate. The second control signal, when asserted, turns on the second switching transistor and causes the reference current source to be mirrored through the second cascode transistor in a direction away from the output node.

One implementation of the gate-switched charge pump also comprises a first input mirror transistor having a source connected to a voltage supply, a gate connected to its drain and to the first switching transistor, and a drain connected to the reference current source. A second input mirror transistor has a source connected to ground, a gate connected to its drain and to the second switching transistor, and a drain connected to the reference voltage. In this implementation, the sources of the first and second switching transistors are connected to the gates of the first and second output mirror transistors, and the drains of the first and second switching transistors are connected to the gates of the first and second input mirror transistors. This implementation further comprises a third switching transistor having a source connected to the voltage supply, a gate connected to an inverted first control signal, and a drain connected to the gate of the first output mirror transistor. A fourth switching transistor has a source connected to ground, a gate connected to an inverted second control signal, and a drain connected to the gate of the second output mirror transistor.

In another embodiment of the present invention, a charge pump comprises a first current mirror comprised of p-channel CMOS transistors coupled on one side of an output node and a second current mirror comprised of n-channel CMOS transistors coupled on an opposite side of the output node. A reference current source is coupled between the current mirrors. A p-channel CMOS cascode transistor is coupled between the first current mirror and the output node, and an n-channel CMOS cascode transistor is coupled between the second current mirror and the output node. A p-channel CMOS transistor switch is coupled to either the source or the gate of an output transistor of the first current mirror and receives a first control signal at its gate. An n-channel CMOS transistor switch is coupled to either the source or the gate of an output transistor of the second current mirror and receives a second control signal at its gate.

Objects and advantages of the present invention include any of the foregoing, singly or in combination. Further objects and advantages will be apparent to those of ordinary skill in the art, or will be set forth in the following disclosure.

BRIEF DESCRIPTION OF THE DRAWINGS

The present invention is described with reference to the accompanying drawings. In the drawings, like reference numbers indicate identical or functionally similar elements.

DETAILED DESCRIPTION OF PREFERRED EMBODIMENTS

Figure 3:
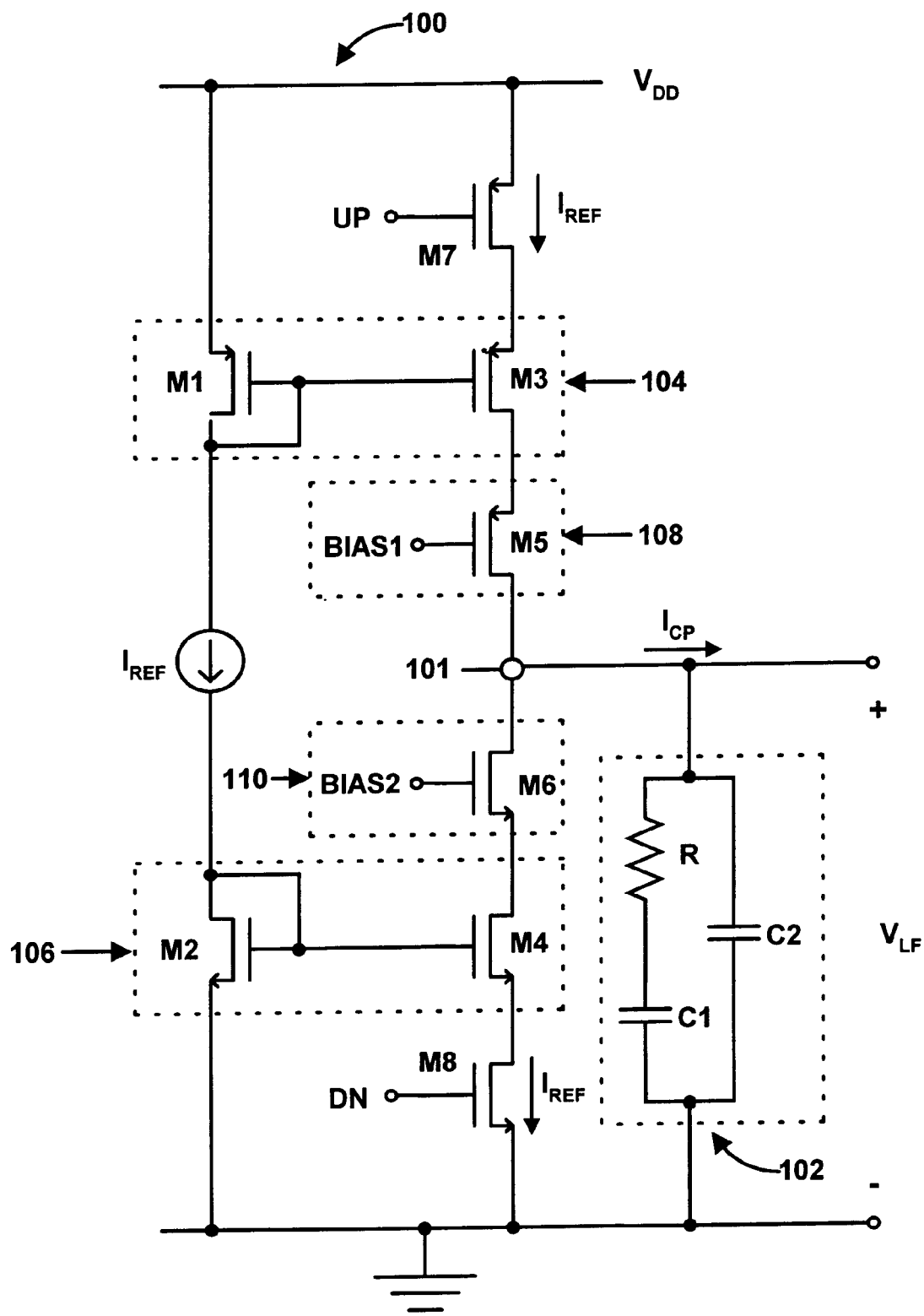
FIG. 3 is a schematic diagram of a source-switched charge pump circuit according to the present invention.

A first embodiment of a charge pump circuit 100 according to the present invention is depicted in schematic detail in FIG. 3. Charge pump 100 has a source-switched configuration and is suitable for implementation in a frequency synthesizer employing a phase-locked loop, such as PLL 10 illustrated in FIG. 1. Charge pump 100 could also be implemented in other circuit arrangements known to those of skill in the art, such as in a delay-locked loop (DLL).

Charge pump 100 includes a "pump-up" PMOS current mirror 104 and an associated "UP" PMOS switching transistor M7, and a "pump-down" NMOS current mirror 106 and an associated "DOWN" NMOS switching transistor M8. UP and DOWN pulses having a duration or width corresponding to phase differences between a reference clock $CLK_{REF}$ and an output clock $CLK_{OUT}$ are applied by a phase/frequency detector to the gates of transistors M7 and M8. Charge pump 100 also includes cascode circuits 108, 110 coupled between, respectively, current mirrors 104, 106 and an output node 101.

Current mirror 104 includes a PMOS input mirror transistor M1 having a gate coupled to the gate of PMOS output mirror transistor M3. The sources of mirror transistors M1 and M3 are coupled to a voltage supply $V_{DD}$. The source of transistor M3 is coupled to the drain of UP switching transistor M7. The drain of transistor M1 is coupled to its gate, in order to insure that the transistor remains in saturation, and the drain of transistor M3 is coupled to the source of cascode transistor M5.

Current mirror 106 is configured with an NMOS input mirror transistor M2 and an NMOS output mirror transistor M4. The gates of mirror transistors M2 and M4 are coupled together, and the source of transistor M2 is tied to ground. The source of transistor M4 is coupled to the drain of DOWN switching transistor M8. The drain of transistor M2 is coupled to its gate, and the drain of transistor M4 is coupled to the source of cascode transistor M6.

Cascode circuit 108, comprising PMOS transistor M5, is interposed between UP current mirror 104 and output node 101. Cascode transistor M5 has a source connected to the drain of output mirror transistor M3 and a gate voltage established by bias voltage BIAS1. The voltage BIAS1 should be sufficient to turn transistor M5 on. Cascode circuit 110, comprising NMOS transistor M6, is interposed between current mirror 106 and output node 101. The source of cascode transistor M6 is connected to the drain of output mirror transistor M4 and its gate voltage is established by bias voltage BIAS2. The voltage BIAS2 should be sufficient to turn transistor M6 on. The drains of cascode transistors M6 and M5 are coupled together at output node 101. Cascode circuits 108 and 110 increase the output impedance of mirrors 104 and 106, and thereby improve the range of voltages over which the output current may be generated. The use of cascoded output also enhances the isolation of switching transistors M7, M8 from output node 101.

Though cascode circuits having only one transistor stage are illustrated, it will be appreciated that cascode circuits configured with more than one transistor could be employed. Similarly, additional transistor stages could be added to the mirror circuits.

Figure 1:
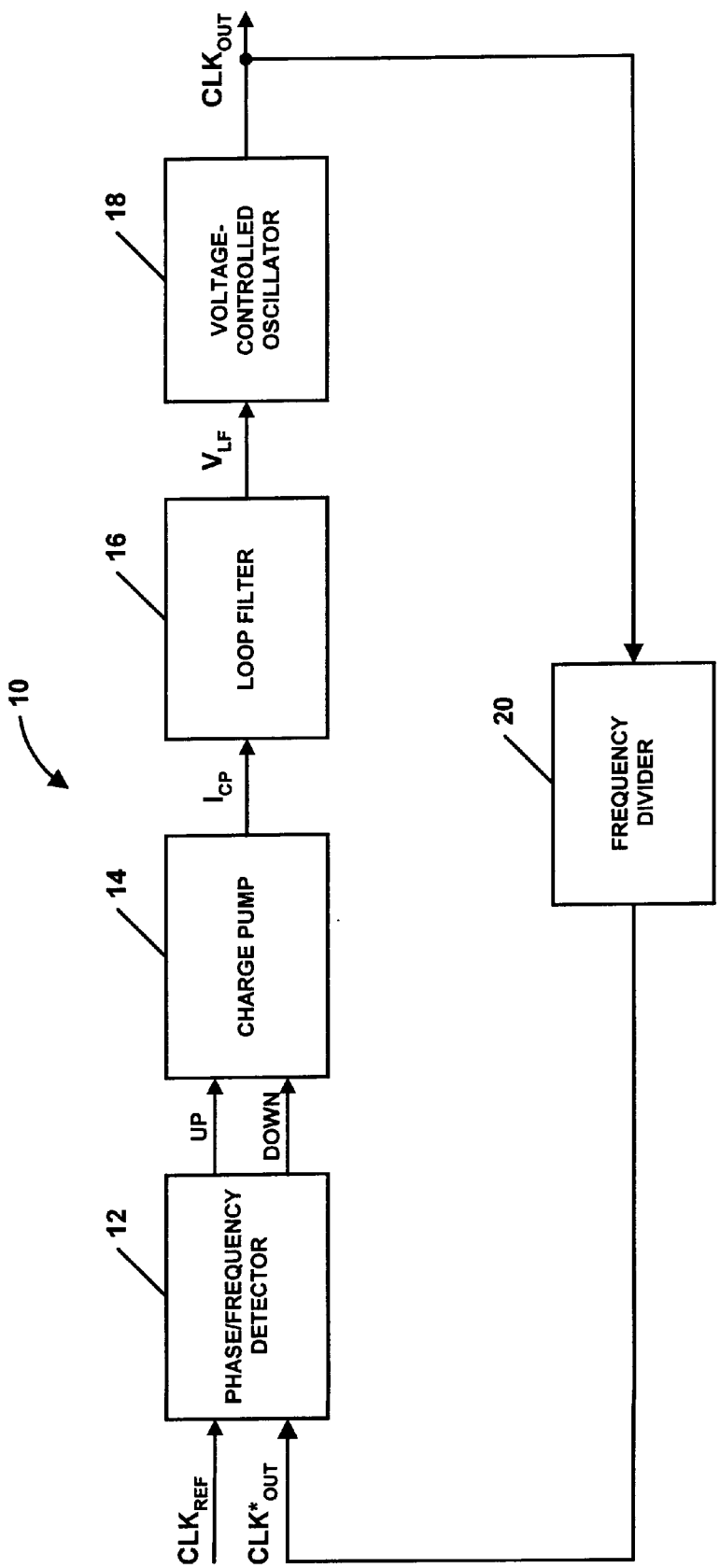
FIG. 1 is a block diagram illustrating the architecture of a typical phase-locked loop.

A reference current source providing a reference current $I_{REF}$ is disposed between the drains of input mirror transistors M1 and M2. Based on the signals applied to the gates of switching transistors M7 and M8 by the phase/frequency detector (which would be connected to charge pump 100 as shown in FIG. 1), the reference current is mirrored through either pump-up current mirror 104 or through pump-down current mirror 106 to direct an output current $I_{CP}$ to or from output node 101. When an "UP" signal is applied to switching transistor M7, consisting of a voltage level sufficient to place transistor M7 in saturation and thereby turn it "on", the reference current is mirrored in the M7-M3-M5 branch towards output node 101. Accordingly, the output current $I_{CP}=+I_{REF}$. Conversely, when a "DOWN" signal is applied to switching transistor M8, transistor M8 turns on and the reference current is mirrored in the M8-M4-M6 branch away from output node 101. Hence, $I_{CP}=-I_{REF}$.

The output current $I_{CP}$ is input to loop filter 102 to generate a voltage $V_{LF}$ that is applied to a voltage-controlled oscillator (which would be connected to loop filter 102 as shown in FIG. 1). Loop filter 102, as shown, consists of a series-connected resistor R and capacitor C1 in parallel with a capacitor C2. Filter 102 could take alternative forms, such as simply a series-connected resistor and capacitor. Here, capacitors C1 and C2 form an integrating capacitor. If, in response to an UP pulse, $I_{CP}=+I_{REF}$, the integrating capacitor is charged and $V_{LF}$ increases by an amount commensurate with the duration of the UP pulse. If, in response to a DOWN pulse, $I_{CP}=-I_{REF}$, the integrating capacitor is discharged and $V_{LF}$ decreases by an amount commensurate with the duration of the DOWN pulse. The oscillating frequency is thereby adjusted as necessary to correct phase differences detected by the phase/frequency detector.

Figure 2:
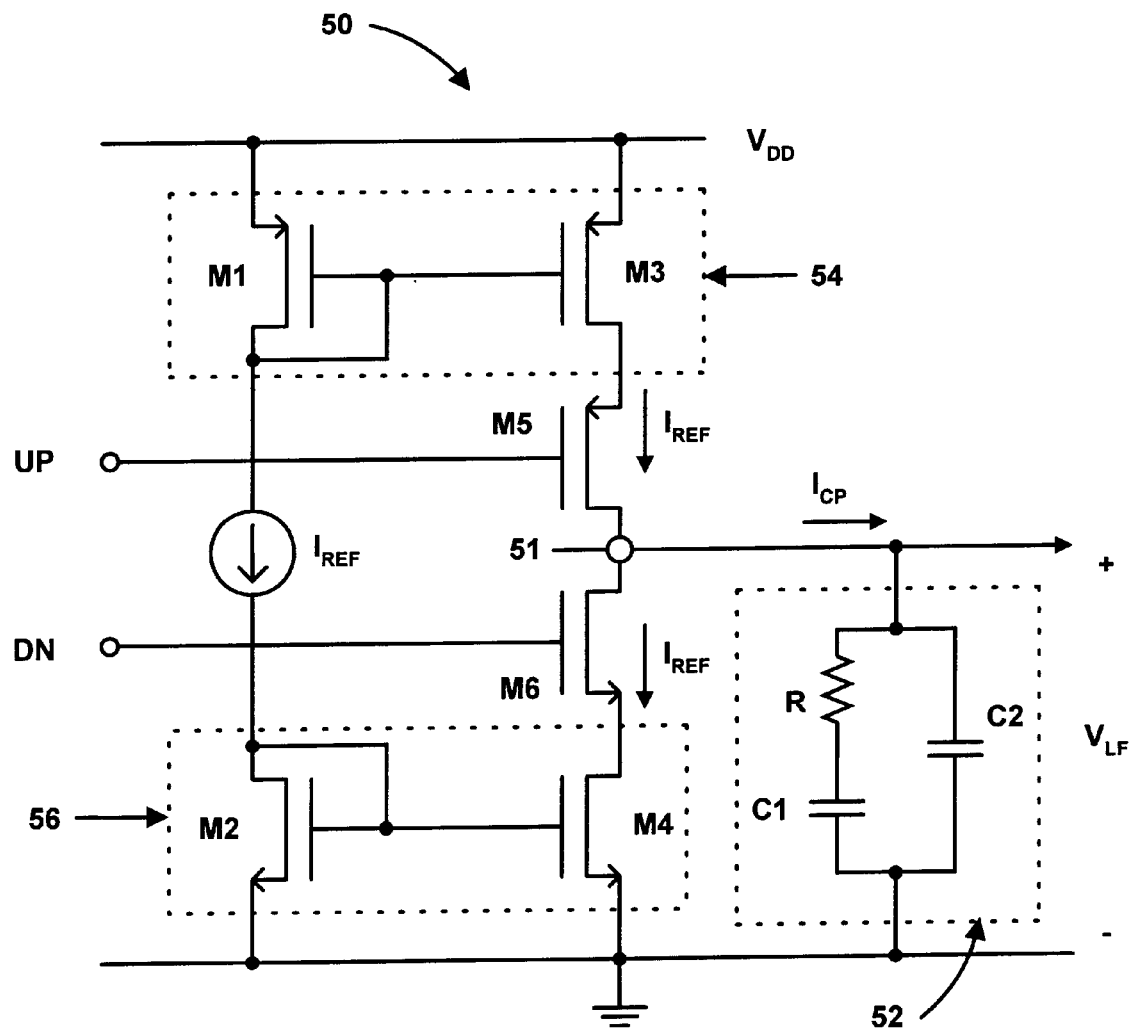
FIG. 2 is a schematic diagram of a conventional charge pump circuit.

Charge pump 100 differs from prior charge pump configurations (such as that illustrated in FIG. 2) based on the placement of switching transistors M7, M8 as well as the introduction of cascode output circuits 108, 110. Each switching transistor M7, M8 is coupled to the source of a mirror transistor M3, M4 rather than to the drain of a mirror transistor. Switching noise (glitch) and spurs resulting from operation of the switches are thereby isolated from output node 101. Another difference is that charge pump 100 applies a reference current $\pm I_{REF}$ to output node 101 via transistors M5, M6 in cascode connection with mirror transistors M3, M4. The use of a cascoded output provides a further reduced level of spurs and switching noise (through further isolation of the switches from the output node). Moreover, the cascoded output increases the output impedance of the current source so that the charge pump current variation is less dependent on the output voltage. This provides charge pump 100 with a fast settling time, which in turn permits a reduction of the turn-on time or pulse duration of the pulses output from the phase/frequency detector. The reduced turn-on time further minimizes spurs and phase noise contribution and thereby provides improved selectivity.

Figure 4:
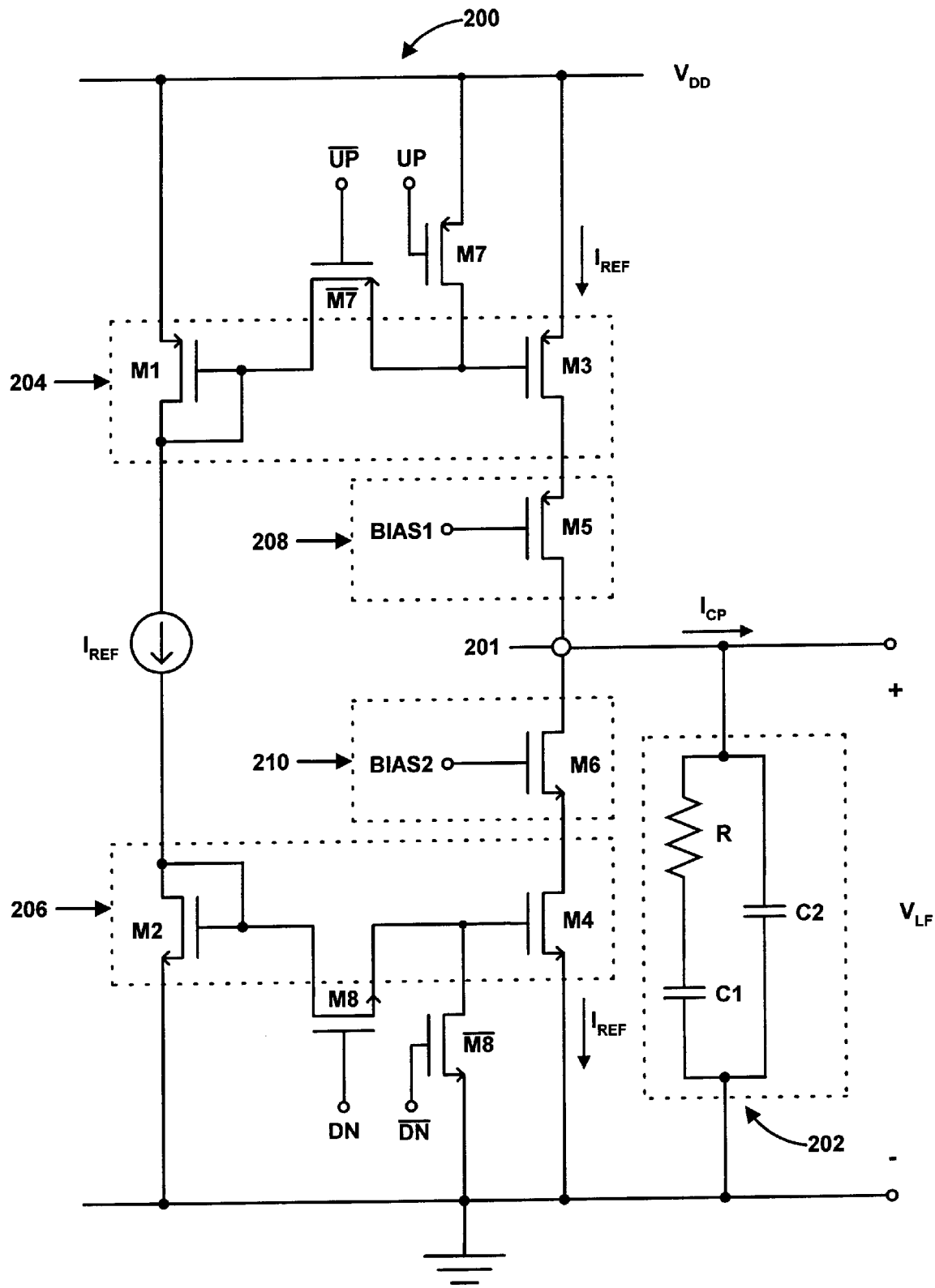
FIG. 4 is a schematic diagram of a gate-switched charge pump circuit according to the present invention.

A second embodiment of a charge pump circuit 200 according to the present invention is depicted in schematic detail in FIG. 4. Charge pump 200 has a gate-switched configuration and is suitable for implementation in a frequency synthesizer employing a phase-locked loop, such as PLL 10 illustrated in FIG. 1. Charge pump 200 could also be implemented in other circuit arrangements known to those of skill in the art, such as in a delay-locked loop (DLL).

Charge pump 200 includes a "pump-up" PMOS current mirror 204 and associated "UP" PMOS switching transistors M7, $\overline{M7}$, and a "pump-down" NMOS current mirror 206 and associated "DOWN" NMOS switching transistors M8, $\overline{M8}$. UP and DN pulses having a duration or width corresponding to phase differences between a reference clock $CLK_{REF}$ and an output clock $CLK_{OUT}$ are applied by a phase/frequency detector to the gates of transistors M7 and M8. Inverted versions of these pulses are applied to the gates of transistors $\overline{M7}$ and $\overline{M8}$. Charge pump 200 also includes cascode circuits 208, 210 coupled, respectively, between current mirrors 204, 206, and an output node 201.

Current mirror 204 includes a PMOS input mirror transistor M1 and a PMOS output mirror transistor M3. The sources of mirror transistors M1 and M3 are coupled to a voltage supply $V_{DD}$. The drain of transistor M1 is coupled to its gate, in order to insure that the transistor remains in saturation, and the drain of transistor M3 is coupled to the source of cascode transistor M5.

Current mirror 204 is controlled by switching transistors M7 and $\overline{M7}$. $\overline{UP}$ switching transistor $\overline{M7}$ is coupled between the gates of mirror transistors M1 and M3, with the drain of transistor $\overline{M7}$ being connected to the gate of input mirror transistor M1 and the source of transistor M7 being coupled to the gate of output mirror transistor M3. The drain of UP switching transistor M7 is also coupled to the gate of output mirror transistor M3, while its source is tied to the voltage supply $V_{DD}$. UP and $\overline{UP}$ pulses are generated by the phase/frequency detector and applied to the gates of, respectively, transistors M7 and $\overline{M7}$. The $\overline{UP}$ pulse is simply an inverted version of the UP pulse.

Current mirror 206 is configured with NMOS input mirror transistors M2 and NMOS output mirror transistor M4. The sources of transistors M2 and M4 are tied to ground. The drain of input mirror transistor M2 is coupled to its gate, and the drain of output mirror transistor M4 is coupled to the source of cascode transistor M6.

Current mirror 206 is controlled by switching transistors M8 and $\overline{M8}$. DN switching transistor M8 is coupled between the gates of mirror transistors M2 and M4, with the drain of transistor M8 being connected to the gate of input mirror transistor M2 and the source of transistor M8 being coupled to the gate of output mirror transistor M4. The drain of $\overline{DN}$ switching transistor $\overline{M8}$ is also coupled to the gate of output mirror transistor M4, while its source is tied to the voltage supply $V_{DD}$. DN and $\overline{DN}$ pulses are generated by the phase/frequency detector and applied to the gates of, respectively, transistors M8 and $\overline{M8}$. The $\overline{DN}$ pulse is simply an inverted version of the DN pulse.

Cascode transistor circuit 208, comprising transistor M5, is interposed between UP current mirror 204 and output node 201. The source of cascode transistor M5 is connected to the drain of output mirror transistor M3, and the gate of transistor M5 is regulated by a bias voltage BIAS1. The voltage BIAS1 should be sufficient to turn transistor M5 on. Cascode circuit 210, comprising transistor M6, is interposed between DOWN current mirror 206 and output node 201. The source of cascode transistor M6 is connected to the drain of output mirror transistor M4 and its gate voltage is established by bias voltage BIAS2. The voltage BIAS2 should be sufficient to turn transistor M6 on. The drains of cascode transistors M5 and M6 are coupled together at output node 201. Cascode circuits 208 and 210 increase the output impedance of mirrors 204 and 206, and thereby improve the range of voltages over which the output current may be generated. The use of cascoded output also enhances the isolation of the switching transistors M7, $\overline{M7}$ and M8, $\overline{M8}$ from output node 201.

Though cascode circuits having only one transistor stage are illustrated, it will be appreciated that cascode circuits configured with more than one transistor could be employed. Similarly, additional transistor stages could be added to the mirror circuits.

A reference current source providing a reference current $I_{REF}$ is disposed between the drains of transistors M1 and M2. Based on the signals applied to the gates of switching transistors M7, $\overline{M7}$ and M8, $\overline{M8}$ by the phase/frequency detector (which would be connected to charge pump 200 as shown in FIG. 1), the reference current is mirrored through either pump-up current mirror 204 or through pump-down current mirror 206. If an UP, $\overline{UP}$ signal is applied to switching transistor M7, $\overline{M7}$, transistor M7, $\overline{M7}$ turns on and the reference current is mirrored at the M3-M5 branch, resulting in an output current $I_{CP}=+I_{REF}$. Conversely, if a DN, $\overline{DN}$ signal is applied to switching transistor M8, $\overline{M8}$, transistor M8, $\overline{M8}$ turns on and the reference current is mirrored at the M4-M6 branch, resulting in an output current $I_{CP}=-I_{REF}$.

Charge pump current $I_{CP}$ is input to loop filter 202, which generates a voltage $V_{LF}$ that is applied to a voltage-controlled oscillator (which would be connected to loop filter 102 as shown in FIG. 1). Loop filter 202, as shown, consists of a series-connected resistor R and capacitor C1 in parallel with a capacitor C2. Filter 202 could take alternative forms, such as simply a series-connected resistor and capacitor. Together, capacitors C1 and C2 form an integrating capacitor. If $I_{CP}=+I_{REF}$, the integrating capacitor is charged and $V_{LF}$ increases by an amount commensurate with the duration of the UP pulse. If $I_{CP}=-I_{REF}$, the integrating capacitor is discharged and $V_{LF}$ decreases by an amount commensurate with the duration of the DOWN pulse. The oscillating frequency is thereby adjusted as necessary to correct phase differences detected by the phase/frequency detector.

Like charge pump 100, charge pump 200 differs from prior charge pump configurations in the positioning of switching transistors M7, $\overline{M7}$ and M8, $\overline{M8}$. In charge pump 200, each of transistors M7, $\overline{M7}$ and M8, $\overline{M8}$ is coupled to the gate of an output mirror transistor M3, M4. Switching noise and spurs are thereby isolated from output node 201. Charge pump 200 also applies a reference current $\pm I_{REF}$ to output node 201 via cascode circuits 208, 210. Increased output impedance, reduced noise and decreased phase detector turn-on times are thereby provided.

The inventive charge pump circuits described herein, and their equivalents, may be implemented in a broad range of applications. They are suitable for use in conventional PLL and DLL circuits and, in particular, can be implemented in GSM frequency synthesizers, CDMA synthesizers, AMPS synthesizers and fractional-N synthesizers. Those of skill in the art will know numerous other applications in which the charge pumps described herein may be implemented.

While particular embodiments of the present invention have been described above, it should be understood that they have been presented by way of example only, and not as limitations. The breadth and scope of the present invention is defined by the following claims and their equivalents, and is not limited by the particular embodiments, implementations and implementation examples described herein.

What is claimed is:

1. A charge pump comprising:

a reference current source;

an output node;

a first switch having first and second states that is normally in the first state, and hat is configured to achieve a second state upon assertion of a first control signal, wherein he first switch is separated from the output node by at least one transistor;

a second switch having first and second states that is normally in the first state, and that is configured to achieve a second state upon assertion of a second control signal, wherein the second switch is separated from the output node by at least one transistor;

first and second cascode circuits coupled to the output node;

a first current mirror coupled to the reference current source and configured to generate a first mirror current and direct the first mirror current through the first cascode circuit to the output node in response to the first switch achieving the second state; and a second current mirror coupled to the reference current source and configured to generate a second mirror current and direct the second mirror current through the second cascode circuit to the output node in response to the second switch achieving the second state.

2. A charge pump as claimed in claim 1, wherein:

the first current mirror comprises a first output mirror transistor coupled between the first cascode circuit and the reference current source; and the second current mirror comprises a second output mirror transistor coupled between the second cascode circuit and the reference current source.

3. A charge pump as claimed in claim 2, wherein:

the first output mirror transistor is a p-channel CMOS transistor having a drain connected to the first cascode circuit; and the second output mirror transistor is an n-channel CMOS transistor having a drain connected to the second cascode circuit.

4. A charge pump as claimed in claim 3, wherein:

the first current mirror further comprises a first input mirror transistor coupled between the first output mirror transistor and the reference current source; and the second current mirror further comprises a second input mirror transistor coupled between the second output mirror transistor and the reference current source.

5. A charge pump as claimed in claim 4, wherein:

the first input mirror transistor is a p-channel CMOS transistor having a drain connected to the reference current source, a gate connected to its drain, and a source connected to a voltage supply; and the second input mirror transistor is an n-channel CMOS transistor having a drain connected to the reference current source, a gate connected to its drain, and a source connected to ground.

6. A charge pump as claimed in claim 3, wherein:
the first switch comprises a first switching transistor that receives the first control signal at its gate and that is coupled to the source of the first output mirror transistor; and
the second switch comprises a second switching transistor that receives the second control signal at its gate and that is coupled to the source of the second output mirror transistor.

7. A charge pump as claimed in claim 6, wherein:
the first switching transistor is a p-channel CMOS transistor having a drain coupled to the source of the first output mirror transistor and a source coupled to a voltage supply; and
the second switching transistor is an n-channel CMOS transistor having a drain coupled to the source of the first output mirror transistor and a source coupled to ground.

8. A charge pump as claimed in claim 4, wherein:
the first switch comprises at least one switching transistor that receives the first control signal at its gate and that is coupled to the gate of the first output mirror transistor; and
the second switch comprises at least one switching transistor that receives the second control signal at its gate and that is coupled to the gate of the second output mirror transistor.

9. A charge pump as claimed in claim 8, wherein:
the first switch comprises a first p-channel CMOS switching transistor that receives the first control signal at its gate and that is coupled between the gate of the first output mirror transistor and a voltage supply, and a second p-channel CMOS switching transistor that receives an inverted first control signal at its gate and that is coupled between the gate of the first output mirror transistor and the gate of the first input mirror transistor; and
the second switch comprises a first n-channel CMOS switching transistor that receives an inverted second control signal at its gate and that is coupled between the gate of the second output mirror transistor and ground, and a second n-channel CMOS switching transistor that receives the second control signal at its gate and that is coupled between the gate of the second output mirror transistor and the gate of the second input mirror transistor.

10. A charge pump as claimed in claim 9, wherein:
the first p-channel switching transistor has a drain connected to the gate of the first output mirror transistor and a source connected to the voltage supply;
the second p-channel switching transistor has a drain connected to the gate of the first input mirror transistor and a source connected to the gate of the first output mirror transistor;
the first n-channel switching transistor has a drain connected to the gate of the second output mirror transistor and a source connected to ground; and
the second n-channel switching transistor has a drain connected to the gate of the second input mirror transistor and a source connected to the gate of the second output mirror transistor.

11. A charge pump as claimed in claim 2, wherein
the first cascode circuit comprises a p-channel CMOS cascode transistor having a source connected to the drain of the first output mirror transistor, a drain connected to the output node, and a gate connected to a first bias voltage source; and
the second cascode circuit comprises an n-channel CMOS cascode transistor having a source connected to the drain of the second output mirror transistor, a drain connected to the output node, and a gate connected to the second bias voltage source.

12. A charge pump as claimed in claim 1, wherein the first current mirror mirrors the reference current and directs the mirrored reference current through the first cascode circuit in a direction towards the output node, and wherein the second current mirror mirrors the reference current and directs the mirrored reference current in a direction away from the output node.

13. A charge pump as claimed in claim 1 in combination with a phase/frequency detector, wherein the first and second control signals are generated by the phase/frequency detector.

14. A charge pump as claimed in claim 13 in combination with a loop filter, wherein an output current $I_{CP}$ is generated at the output node and is applied as an input to the loop filter to generate an output voltage $V_{LF}$.

15. A source-switched, cascoded-output charge pump comprising:
a reference current source;
an output node;
a first cascode transistor coupled to a first side of the output node;
a first output mirror transistor coupled between the first cascode transistor and the reference current source;
a first switching transistor coupled to the source of the first output mirror transistor and receiving a first control signal at its gate, the first control signal turning on the first switching transistor and causing the reference current source to be mirrored by the first output mirror transistor through the first cascode transistor in a direction towards the output node;
a second cascode transistor coupled to a second side of the output node;
a second output mirror transistor coupled between the second cascode transistor and the reference current source; and
a second switching transistor coupled to the source of the second output mirror transistor receiving a second control signal at its gate, the second control signal turning on the second switching transistor and causing the reference current source to be mirrored by the second output mirror transistor through the second cascode transistor in a direction away from the output node.

16. A charge pump as claimed in claim 15, wherein the first transistors are p-channel CMOS transistors and the second transistors are n-channel CMOS transistors.

17. A charge pump as claimed in claim 16, wherein:
the first switching transistor has a source connected to a voltage supply and a drain connected to the source of the first output mirror transistor; and
the second switching transistor has a source connected to ground and a drain connected to the source of the second output mirror transistor.

18. A charge pump as claimed in claim 17, wherein:
the first cascode transistor has a drain coupled to the output node, a source connected to the drain of the first output mirror transistor, and a gate connected to a first bias voltage supply; and the second cascode transistor has a drain coupled to the output node, a source connected to the drain of the second output mirror transistor; and a gate connected to a second bias voltage supply.

19. A charge pump as claimed in claim 18, and further comprising:

a first input mirror transistor having a source connected to the supply voltage, a gate connected to its drain and to the gate of the first output mirror transistor, and a drain coupled to the reference current source; and a second input mirror transistor having a source coupled to ground, a gate coupled to its drain and to the gate of the second output mirror transistor, and a drain coupled to the reference current source.

20. A gate-switched, cascoded-output charge pump comprising:

a reference current source;

an output node;

a first cascode transistor coupled to a first side of the output node;

a first output mirror transistor coupled between the first cascode transistor and the reference current source;

a first switching transistor coupled to the gate of the first output mirror transistor and receiving a first control signal at its gate, the first control signal turning on the first switching transistor and causing the reference current source to be mirrored by the first output mirror transistor through the first cascode transistor in a direction towards the output node;

a second cascode transistor coupled to a second side of the output node;

a second output mirror transistor coupled between the second cascode transistor and the reference current source; and a second switching transistor coupled to the gate of the second output mirror transistor receiving a second control signal at its gate, the second control signal turning on the second switching transistor and causing the reference current source to be mirrored by the second output mirror transistor through the second cascode transistor in a direction away from the output node.

21. A charge pump as claimed in claim 20, wherein the first transistors are p-channel CMOS transistors and the second transistors are n-channel CMOS transistors.

22. A charge pump as claimed in claim 21, and further comprising:

a first input mirror transistor having a source connected to the supply voltage, a gate connected to its drain and to the first switching transistor, and a drain coupled to the reference current source; and a second input mirror transistor having a source coupled to ground, a gate coupled to its drain and to the second switching transistor, and a drain coupled to the reference current source.

23. A charge pump as claimed in claim 22, wherein:

the first switching transistor has a source connected to the gate of the first output mirror transistor and a drain connected to the gate of the first input mirror transistor; and the second switching transistor has a source connected to the gate of the first output mirror transistor and a drain connected to the gate of the second input mirror transistor.

24. A charge pump as claimed in claim 23, and further comprising:

a third switching transistor having a source connected to the supply voltage, a gate connected to an inverted first control signal, and a drain connected to the gate of the first output mirror transistor; and a fourth switching transistor having a source connected to ground, a gate connected to an inverted second control signal, and a drain connected to the gate of the second output mirror transistor.

25. A charge pump as claimed in claim 24, wherein:

the first cascode transistor has a drain coupled to the output node, a source connected to the drain of the first output mirror transistor, and a gate connected to a first bias voltage supply; and the second cascode transistor has a drain coupled to the output node, a source connected to the drain of the second output mirror transistor; and a gate connected to a second bias voltage supply.

26. A charge pump comprising:

a first current mirror comprised of p-channel CMOS transistors coupled on one side of an output node and a second current mirror comprised of n-channel CMOS transistors coupled on an opposite side of the output node;

a reference current source coupled between the current mirrors;

a p-channel CMOS cascode transistor coupled between the first current mirror and the output node and an n-channel CMOS cascode transistor coupled between the second current mirror and the output node;

a p-channel CMOS transistor switch coupled to either the source or the gate of an output transistor of the first current mirror that receives a first control signal at its gate; and an n-channel CMOS transistor switch coupled to either the source or the gate of an output transistor of the second current mirror that receives a second control signal at its gate.

* * * * *